(12) United States Patent
Xu

(10) Patent No.: US 11,808,504 B2
(45) Date of Patent: Nov. 7, 2023

(54) CRYOGENIC DEVICE AND CRYOSTAT

(71) Applicant: SUMITOMO HEAVY INDUSTRIES, LTD., Tokyo (JP)

(72) Inventor: Mingyao Xu, Nishitokyo (JP)

(73) Assignee: SUMITOMO HEAVY INDUSTRIES, LTD., Tokyo (JP)

(*) Notice: Subject to any disclaimer, the term of this patent is extended or adjusted under 35 U.S.C. 154(b) by 63 days.

(21) Appl. No.: 17/530,467

(22) Filed: Nov. 19, 2021

(65) Prior Publication Data

US 2022/0074629 A1 Mar. 10, 2022

Related U.S. Application Data

(63) Continuation of application No. PCT/JP2020/019770, filed on May 19, 2020.

(30) Foreign Application Priority Data

May 20, 2019 (JP) ................................. 2019-094541

(51) Int. Cl.
*F25B 9/14* (2006.01)
*F25B 9/10* (2006.01)

(52) U.S. Cl.
CPC ............... *F25B 9/145* (2013.01); *F25B 9/10* (2013.01); *F25B 2309/1412* (2013.01)

(58) Field of Classification Search
CPC .... F25B 9/145; F25B 9/10; F25B 2309/1412; F25B 9/002; F25B 2309/1427; H10N 60/81
See application file for complete search history.

(56) References Cited

U.S. PATENT DOCUMENTS 6,990,818 B2 1/2006 Hofmann
9,234,691 B2 1/2016 Black et al.
(Continued)

FOREIGN PATENT DOCUMENTS

CN 102971594 A 3/2013
CN 108037473 A 5/2018
(Continued)

OTHER PUBLICATIONS

International Search Report dated Jul. 14, 2020, relating International Patent Application No. PCT/JP2020/019770 with English translation pp. 1-7.
(Continued)

*Primary Examiner* — Lionel Nouketcha
(74) *Attorney, Agent, or Firm* — HEA LAW PLLC

(57) ABSTRACT

A cryogenic device includes: a hermetic container; a cryocooler including a mounting portion mounted on the container, a connecting part extending from the mounting portion into the container in an axial direction of the cryocooler, and a cooling stage attached to the connecting part and disposed in the container; and a member to be cooled that is disposed in the container with a gap, which is configured to allow heat to be exchanged, between the cooling stage and the member. The cooling stage includes a cold fin extending in a direction perpendicular to the axial direction. A fin receiving groove recessed in the direction perpendicular to the axial direction is formed in the member to be cooled and extends in the axial direction, and the member to be cooled receives the cold fin in the fin receiving groove with the gap.

10 Claims, 2 Drawing Sheets

(56) References Cited

U.S. PATENT DOCUMENTS

| | | | |
|---|---|---|---|
| 9,982,840 B2 | 5/2018 | Wikus et al. | |
| 11,199,295 B2 | 12/2021 | Fan et al. | |
| 2007/0051115 A1 | 3/2007 | Kraus et al. | |
| 2008/0104968 A1* | 5/2008 | Radovinsky | F25D 19/006 |
| | | | 165/185 |
| 2008/0155995 A1 | 7/2008 | Hughes et al. | |
| 2009/0272127 A1* | 11/2009 | Radovinsky | F25D 19/006 |
| | | | 62/50.7 |
| 2009/0293505 A1 | 12/2009 | Wang | |

FOREIGN PATENT DOCUMENTS

| | | |
|---|---|---|
| FR | 3065064 A1 | 10/2018 |
| GB | 2533026 A | 6/2016 |
| JP | S6195585 A | 5/1986 |
| JP | S62167059 U | 10/1987 |
| JP | 2004537026 A | 12/2004 |
| JP | 2006054444 A | 2/2006 |
| JP | 2016075667 A | 5/2016 |

OTHER PUBLICATIONS

International Preliminary Report on Patentability dated Dec. 2, 2021, relating International Patent Application No. PCT/JP2020/019770 with English translation pp. 1-10.

\* cited by examiner

US 11,808,504 B2

CRYOGENIC DEVICE AND CRYOSTAT

RELATED APPLICATIONS

The contents of Japanese Patent Application No. 2019-094541, and of International Patent Application No. PCT/JP2020/019770, on the basis of each of which priority benefits are claimed in an accompanying application data sheet, are in their entirety incorporated herein by reference.

BACKGROUND

Technical Field

Certain embodiments of the present invention relate to a cryogenic device and a cryostat.

Description of Related Art

A low-boiling gas recondensing device which uses a cryocooler and in which a cold body of the cryocooler is thermally coupled to a heat transfer ring without being in contact with a heat transfer ring in order to facilitate the attachment and removal of the cryocooler has been known in the related art. A gap of a constant interval is formed between the cold body and the heat transfer ring. The heat transfer ring is attached to a container for liquefied low-boiling gas. The cold body cools the heat transfer ring through the gap. As a result, the container for liquefied gas is cooled.

SUMMARY

According to an aspect of the invention, a cryogenic device includes: a hermetic container; a cryocooler that includes a mounting portion mounted on the hermetic container, a connecting part extending from the mounting portion into the hermetic container in an axial direction of the cryocooler, and a cooling stage attached to the connecting part and disposed in the hermetic container; and a member to be cooled that is disposed in the hermetic container with a gap, which allows heat to be exchanged, between the cooling stage and the member to be cooled. The cooling stage includes a cold fin that extends toward the member to be cooled in a direction perpendicular to the axial direction of the cryocooler. A fin receiving groove recessed in the direction perpendicular to the axial direction of the cryocooler is formed in the member to be cooled, the fin receiving groove extends in the axial direction of the cryocooler, and the member to be cooled receives the cold fin in the fin receiving groove with the gap.

According to another aspect of the invention, a cryostat includes the above-mentioned cryogenic device.

Any combination of the above-mentioned components, and aspects in which the components or expressions of the invention are substituted with each other between a method, a device, a system, and the like are also effective as the aspects of the invention.

DETAILED DESCRIPTION

Figure 1:
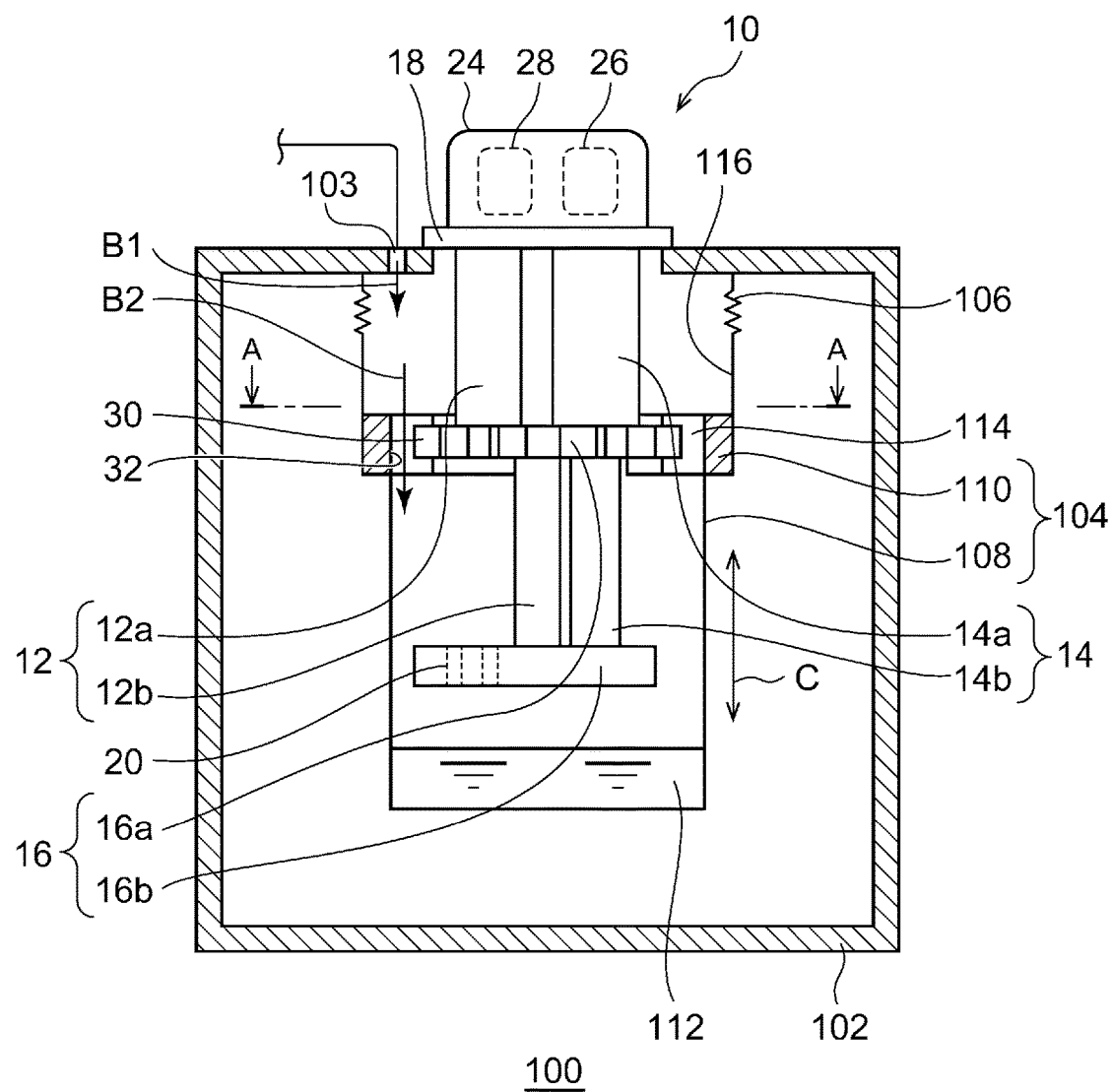
FIG. 1 is a schematic diagram showing a cryogenic device according to an embodiment.

In the recondensing device, the gap formed between the cold body and the heat transfer ring is also a passage for evaporated low-boiling gas. The flow of low-boiling gas may include contaminants or particles, such as fine particles generated due to the liquefaction or solidification of the gas itself. Since the gap is extremely narrow, the particles may be accumulated in the gap. As a result, there is a problem that the particles clog the gap and obstruct the flow of gas.

It is desirable to provide a cryogenic device and a cryostat that reduce the risk of clogging of a gap formed between a cooling stage and a member to be cooled.

Embodiments of the invention will be described in detail below with reference to the drawings. The same or equivalent components, members, and processing in the description and the drawings will be denoted by the same reference numerals and the repeated description thereof will be appropriately omitted. The scale and shape of each part to be shown are conveniently set to facilitate the description, and are not interpreted in a limited way as long as not particularly mentioned. The embodiments are exemplary and do not limit the scope of the invention at all. All features to be described in the embodiments and combinations thereof are not necessarily essential to the invention.

Figure 2:
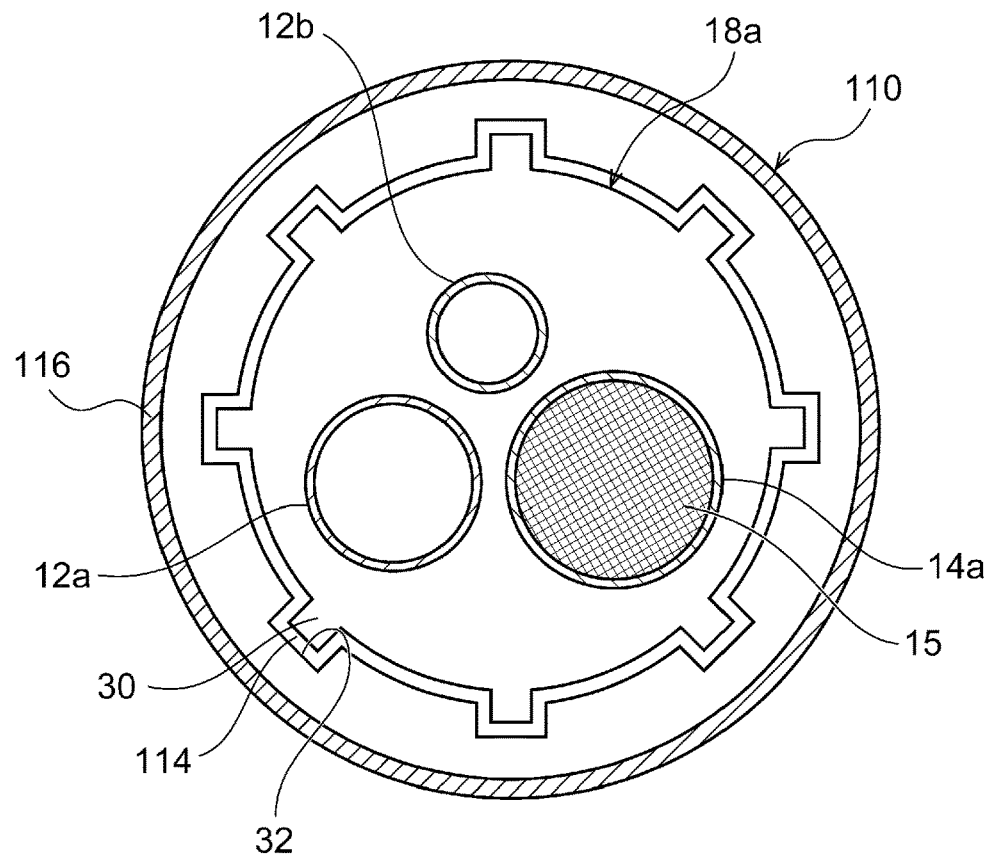
FIG. 2 is a schematic cross-sectional view of the cryogenic device shown in FIG. 1 taken along line A-A.

FIG. 1 is a schematic diagram showing a cryogenic device 100 according to an embodiment. FIG. 2 is a schematic cross-sectional view of the cryogenic device 100 shown in FIG. 1 taken along line A-A. FIG. 2 shows a positional relationship between components of the cryogenic device 100 in a plane perpendicular to an axial direction C of a cryocooler.

In this embodiment, the cryogenic device 100 is applied to a cryostat that has a function to recondense a refrigerant. The cryogenic device 100 includes a cryocooler 10, a hermetic container 102 in which the cryocooler 10 is installed, and a member 104 to be cooled that is disposed in the hermetic container 102 and is cooled by the cryocooler 10.

The refrigerant is, for example, helium. Accordingly, helium gas is recondensed into liquid helium by the cryocooler 10. However, the cryogenic device 100 can also use other appropriate refrigerants, such as nitrogen.

The hermetic container 102 is adapted to keep the airtightness of an internal space. In this embodiment, the hermetic container 102 includes an opening portion which is formed in, for example, a top plate or the other wall surface thereof and on which the cryocooler 10 is to be mounted. A low-temperature section of the cryocooler 10 is inserted into the hermetic container 102 through this opening portion, and a room-temperature section of the cryocooler 10 is attached to the opening portion. The hermetic container 102 is also used as a vacuum container that keeps an internal space vacuum.

The member 104 to be cooled is disposed in the hermetic container 102. A refrigerant section, which accommodates the gas and liquid of the refrigerant, is formed in the member 104 to be cooled, and this refrigerant section is isolated from the outside of the member 104 to be cooled (that is, a space between the hermetic container 102 and the member 104 to be cooled). It can also be said that the member 104 to be cooled is a container for accommodating the refrigerant.

The member 104 to be cooled may include a refrigerant introduction port 103 at a portion thereof near the cryocooler 10 or at other portions thereof. Refrigerant gas can be introduced into the member 104 to be cooled from the outside through the refrigerant introduction port 103. The member 104 to be cooled may include a refrigerant outlet. Refrigerant gas can be discharged to the outside of the member 104 to be cooled through the refrigerant outlet.

The member 104 to be cooled is connected to the hermetic container 102 through a vibration insulating part 106 and a connection member 116. The vibration insulating part 106 is adapted to prevent vibration, which is caused by the operation of the cryocooler 10, or other vibration, which is transmitted from a surrounding environment, from being transmitted to the member 104 to be cooled, or at least to reduce this vibration. The vibration insulating part 106 may be, for example, a damper, bellows, vibration-proof rubber, other appropriate vibration insulating members, or other appropriate vibration insulating structures. The vibration insulating part 106 connects a relatively high-temperature portion of the member 104 to be cooled, such as the room-temperature section, to the hermetic container 102. Since a general-purpose vibration insulating part, which can be used in a room-temperature environment, can be employed in this case, it is convenient. Since the cryogenic device 100 is adapted to protect the member 104 to be cooled from vibration in this way, a low-vibration or vibration-free cryostat is provided in this embodiment.

The member 104 to be cooled includes a liquefied refrigerant tank 108 and a heat conductive sleeve 110 attached to the liquefied refrigerant tank 108. A liquefied refrigerant 112, for example, liquid helium is stored in the liquefied refrigerant tank 108. The liquefied refrigerant tank 108 is cooled by the cryocooler 10 through the heat conductive sleeve 110. In order to suppress the entry of heat into the liquefied refrigerant tank 108 from the surrounding environment and the hermetic container 102, the member 104 to be cooled may include a heat shield that is disposed between the hermetic container 102 and the liquefied refrigerant tank 108 to surround the liquefied refrigerant tank 108. Such a heat shield may be cooled by the heat conductive sleeve 110.

The heat conductive sleeve 110 of the member 104 to be cooled is disposed in the hermetic container 102 with a gap, which allows heat to be exchanged, between a first-stage cooling stage 16a and the heat conductive sleeve 110. Hereinafter, this gap is also referred to as a heat exchange gap 114. The heat conductive sleeve 110 is thermally coupled to the cryocooler 10 without being in contact with the cryocooler 10. The heat conductive sleeve 110 is made of a metal material having high thermal conductivity, such as copper.

The entire member 104 to be cooled is disposed without being in contact with the low-temperature section of the cryocooler 10. Accordingly, not only the heat conductive sleeve 110 but also the liquefied refrigerant tank 108 is not in physical contact with the cryocooler 10.

The heat conductive sleeve 110 is connected to the vibration insulating part 106 by the connection member (for example, a thin-walled tubular member) 116, and is supported by the hermetic container 102 (for example, a top plate of the hermetic container 102) through the vibration insulating part 106. For example, the connection member 116 is formed to be thinner than the heat conductive sleeve 110, and is connected to the heat conductive sleeve 110 at the outer peripheral portion of the heat conductive sleeve 110.

The cryocooler 10 is, for example, a Gifford-McMahon (GM) two-stage pulse tube cryocooler. Accordingly, the cryocooler 10 includes a first-stage pulse tube 12a, a second-stage pulse tube 12b, a first-stage regenerator tube 14a, a second-stage regenerator tube 14b, a first-stage cooling stage 16a, and a second-stage cooling stage 16b. For convenience of description, the first-stage pulse tube 12a and the second-stage pulse tube 12b may be collectively referred to as a pulse tube 12 in the following description. Likewise, the first-stage regenerator tube 14a and the second-stage regenerator tube 14b may be collectively referred to as a regenerator tube 14, and the first-stage cooling stage 16a and the second-stage cooling stage 16b may be collectively referred to as a cooling stage 16.

Further, the cryocooler 10 includes amounting portion 18 that is mounted on the hermetic container 102. The mounting portion 18 may be, for example, a vacuum flange that can be attached to the opening portion of the hermetic container 102. The first-stage pulse tube 12a connects the mounting portion 18 to the first-stage cooling stage 16a, and the second-stage pulse tube 12b connects the mounting portion 18 to the second-stage cooling stage 16b. The first-stage regenerator tube 14a connects the mounting portion 18 to the first-stage cooling stage 16a. The second-stage regenerator tube 14b connects the first-stage cooling stage 16a to the second-stage cooling stage 16b. The mounting portion 18 may be referred to as a top flange.

The pulse tube 12 and/or the regenerator tube 14 are regarded as connecting parts that extend from the mounting portion 18 into the hermetic container 102 in an axial direction C of the cryocooler. The first-stage cooling stage 16a is attached to the connecting parts (for example, the first-stage pulse tube 12a and the first-stage regenerator tube 14a), and is disposed in the hermetic container 102. Likewise, the second-stage cooling stage 16b is attached to the connecting parts (for example, the second-stage pulse tube 12b and the second-stage regenerator tube 14b), and is disposed in the hermetic container 102.

In this embodiment, the cryocooler 10 is detachably installed on the top plate or an upper portion of the hermetic container 102 so that the center axis of the cryocooler 10 coincides with a vertical direction, and the cooling stage 16 is disposed in the hermetic container 102. Accordingly, the axial direction C of the cryocooler is the vertical direction. However, the attachment posture of the cryocooler 10 is not limited thereto. Since the cryocooler 10 can be installed in a desired posture, the cryocooler 10 may be installed on the hermetic container 102 so that the axial direction C of the cryocooler coincides with an oblique direction or a horizontal direction.

Each of the first-stage pulse tube 12a and the second-stage pulse tube 12b extends in the axial direction C of the cryocooler. Further, the first-stage regenerator tube 14a and the second-stage regenerator tube 14b are connected in series and extend in the axial direction C of the cryocooler. The first-stage regenerator tube 14a is disposed in parallel with the first-stage pulse tube 12a, and the second-stage regenerator tube 14b is disposed in parallel with the second-stage pulse tube 12b. The first-stage pulse tube 12a has substantially the same length as the first-stage regenerator tube 14a in the axial direction C of the cryocooler, and the second-stage pulse tube 12b has substantially the same length as the sum of the lengths of the first-stage regenerator tube 14a and the second-stage regenerator tube 14b in the axial direction C of the cryocooler.

In exemplary configuration, the pulse tube 12 is a cylindrical tube in which a cavity is formed, the regenerator tube 14 is a cylindrical tube that is filled with a regenerator material 15, and both the pulse tube 12 and the regenerator tube 14 are disposed adjacent to each other so that the center axes of the pulse tube 12 and the regenerator tube 14 are parallel to each other.

A low-temperature end of the first-stage pulse tube 12a and a low-temperature end of the first-stage regenerator tube 14a are structurally connected and thermally coupled to each other by the first-stage cooling stage 16a. The first-stage cooling stage 16a has an internal flow channel, and working gas of the cryocooler 10 can flow between the low-temperature end of the first-stage pulse tube 12a and the low-temperature end of the first-stage regenerator tube 14a through this internal flow channel. Likewise, a low-temperature end of the second-stage pulse tube 12b and a low-temperature end of the second-stage regenerator tube 14b are structurally connected and thermally coupled to each other by the second-stage cooling stage 16b. Further, the low-temperature end of the second-stage pulse tube 12b and the low-temperature end of the second-stage regenerator tube 14b are connected to each other by an internal flow channel of the second-stage cooling stage 16b. On the other hand, high-temperature ends of the first-stage pulse tube 12a and the first-stage regenerator tube 14a are connected to each other by the mounting portion 18.

The cooling stage 16 is made of a metal material having high thermal conductivity, such as copper. On the other hand, the pulse tube 12 and the regenerator tube 14 are made of a metal material, which has thermal conductivity lower than the thermal conductivity of the cooling stage 16, such as stainless steel.

The second-stage cooling stage 16b may include at least one condensation hole 20 that condenses a refrigerant. The condensation hole 20 passes through the second-stage cooling stage 16b in the axial direction C of the cryocooler.

The pulse tube 12 and the regenerator tube 14 extend from one main surface of the mounting portion 18, and a head part 24 is provided on the other main surface of the mounting portion 18. As described above, the mounting portion 18 is, for example, a vacuum flange and is attached to the hermetic container 102 to keep the airtightness of the hermetic container 102. In a case where the mounting portion 18 is attached to the hermetic container 102, the pulse tube 12, the regenerator tube 14, and the cooling stage 16 are accommodated in the hermetic container 102 and the head part 24 is disposed outside the hermetic container 102.

The head part 24 is provided with an oscillating flow generation source 26 and a phase control mechanism 28 of the cryocooler 10. As well known, in a case where the cryocooler 10 is a GM type pulse tube cryocooler, a combination of a compressor that generates the steady flow of working gas and a flow channel switching valve that periodically switches the high-pressure side and the low-pressure side of the compressor to connect the high-pressure side and the low-pressure side to the pulse tube 12 and the regenerator tube 14 is used as the oscillating flow generation source 26. This flow channel switching valve also functions as the phase control mechanism 28 together with a buffer tank that is provided as necessary. Further, in a case where the cryocooler 10 is a Stirling type pulse tube cryocooler, a compressor, which generates oscillating flow by a piston oscillating harmonically, is used as the oscillating flow generation source 26 and a buffer tank and a communication channel, which connects the buffer tank to the high-temperature end of the pulse tube 12, are used as the phase control mechanism 28.

The oscillating flow generation source 26 does not need to be built in the head part 24 (that is, the oscillating flow generation source 26 may not be directly attached to the mounting portion 18). The oscillating flow generation source 26 may be disposed to be separated from the head part 24, and may be connected to the head part 24 by a pipe having stiffness or flexibility. Likewise, it is not essential that the phase control mechanism 28 is directly attached to the mounting portion 18, and the phase control mechanism 28 may also be disposed to be separated from the head part 24 and may be connected to the head part 24 by a pipe having stiffness or flexibility.

According to this configuration, in a case where the cryocooler 10 appropriately delays the phase of the displacement oscillation of a gas element (also referred to as a gas piston), which is present in the pulse tube 12, with respect to the pressure oscillation of the working gas, the cryocooler 10 can generate PV work at the low-temperature end of the pulse tube 12 and cool the cooling stage 16. In this way, the cryocooler 10 can cool gas and liquid that are in contact with the cooling stage 16 or an object that is thermally coupled to the cooling stage 16.

In a case where the cryocooler 10 is used to recondense helium, the first-stage cooling stage 16a is cooled to, for example, a temperature lower than 100K (for example, about 30K to 60K) and the second-stage cooling stage 16b is cooled to about 4K or less that is the liquefaction temperature of helium. In a case where the cryocooler 10 is used to recondense another refrigerant, at least the second-stage cooling stage 16b is cooled to a temperature that is equal to or lower than the liquefaction temperature of the refrigerant.

For example, helium gas is often used as the working gas that circulates in the cryocooler 10 to cool the cryocooler 10. In this way, the working gas of the cryocooler 10 may be the same gas as refrigerant gas that is to be recondensed by the cryogenic device 100. However, in this embodiment, a flow channel for the working gas of the cryocooler 10 is isolated from a flow channel for the refrigerant gas to be recondensed. Accordingly, these gases are not mixed with each other.

The first-stage cooling stage 16a includes at least one cold fin 30 that extends toward the heat conductive sleeve 110 of the member 104 to be cooled in a direction perpendicular to the axial direction C of the cryocooler. A plurality of cold fins 30 are provided in this embodiment, and eight cold fins 30 are shown in FIG. 2. The number of the cold fins 30 is not particularly limited, and the first-stage cooling stage 16a may be provided with an arbitrary number of cold fins 30.

The first-stage cooling stage 16a includes a main body to which the pulse tube 12 and the regenerator tube 14 are fixed, and the cold fins 30 extend from the main body of the first-stage cooling stage 16a along the plane perpendicular to the axial direction C of the cryocooler. In this embodiment, the main body of the first-stage cooling stage 16a may have a discoid shape or a columnar shape and the cold fins 30 extend outward from the main body of the first-stage cooling stage 16a in a radial direction of the cryocooler 10 perpendicular to the axial direction C of the cryocooler. The tip end surface (that is, the outermost surface in the radial direction) of each cold fin 30 may form a part of a cylindrical surface of which the center axis passes through the center of the main body of the first-stage cooling stage 16a. The first-stage cooling stage 16a may have a shape like an external gear as a whole as seen in the axial direction C of the cryocooler.

For example, the respective cold fins 30 are formed to have the same size. That is, the lengths of the respective cold fins 30 are equal to each other, the widths of the respective fins are equal to each other, and the heights of the respective fins are equal to each other. The length of the fin is the radial dimension of the fin, and corresponds to a distance between the main body of the first-stage cooling stage 16a and the tip end surface of the fin. The width of the fin corresponds to the circumferential dimension of the fin. The height of the fin is the dimension of the fin in the axial direction C of the cryocooler.

In this example, the length of the cold fin 30 is shorter than the radius of the main body of the first-stage cooling stage 16a and is shorter than, for example, a half of the radius of the main body. However, the length of the cold fin 30 is not limited thereto and may be equal to or larger than the radius of the main body of the first-stage cooling stage 16a. The width of the cold fin 30 is shorter than an interval between two cold fins 30 adjacent to each other in the circumferential direction. However, the width of the cold fin 30 is not limited thereto and may be equal to or larger than such an interval.

Further, the height of the cold fin 30 is equal to the thickness (axial dimension) of the first-stage cooling stage 16a, and the upper surface and the lower surface of the fin are flush with the upper surface of the main body of the first-stage cooling stage 16a and the lower surface of the main body, respectively. However, the height of the cold fin 30 may be larger or smaller than the thickness of the first-stage cooling stage 16a. Furthermore, the cold fins 30 may be provided on the main body of the first-stage cooling stage 16a at positions that are slightly deviated from the main body of the first-stage cooling stage 16a in the axial direction C of the cryocooler.

The cold fins 30 are arranged at regular angular intervals over the entire circumference of the first-stage cooling stage 16a. However, the cold fins 30 may be provided on only a portion of the outer periphery of the first-stage cooling stage 16a. Further, the cold fins 30 may be arranged at irregular angular intervals.

Fin receiving grooves 32, which are recessed in the direction perpendicular to the axial direction C of the cryocooler, are formed in the heat conductive sleeve 110 of the member 104 to be cooled. The heat conductive sleeve 110 of the member 104 to be cooled receives the cold fins 30 in the fin receiving grooves 32 with the heat exchange gap 114.

The heat conductive sleeve 110 is disposed around the first-stage cooling stage 16a to surround the first-stage cooling stage 16a, so that the heat exchange gap 114 is formed between the heat conductive sleeve 110 and the first-stage cooling stage 16a as described above.

The heat conductive sleeve 110 includes a central opening portion that receives the first-stage cooling stage 16a and passes therethrough in the axial direction C of the cryocooler, and the fin receiving grooves 32 and the heat exchange gap 114 form a part of the central opening portion. The heat conductive sleeve 110 has the shape of a circular ring that is disposed coaxially with the first-stage cooling stage 16a. The heat conductive sleeve 110 faces only the outer peripheral surface of the first-stage cooling stage 16a provided with the cold fins 30, and does not cover the bottom surface of the first-stage cooling stage 16a. The bottom surface of the first-stage cooling stage 16a faces the second-stage cooling stage 16b in the liquefied refrigerant tank 108. The heat conductive sleeve 110 also does not cover the upper surface of the first-stage cooling stage 16a.

The fin receiving grooves 32 are recessed outward from the inner peripheral surface of the heat conductive sleeve 110, which forms the heat exchange gap 114, in a plane perpendicular to the axial direction C of the cryocooler. The fin receiving grooves 32, of which the number is the same as the number of the cold fins 30, are provided and correspond to the cold fins 30 one to one. The size and shape of the fin receiving groove 32 are determined so that the heat exchange gap 114 is formed between the fin receiving groove 32 and the corresponding cold fin 30. The heat conductive sleeve 110 may have a shape like an internal gear that meshes with the first-stage cooling stage 16a as a whole as seen in the axial direction C of the cryocooler (However, as described above, the heat conductive sleeve 110 and the first-stage cooling stage 16a are separated from each other by the heat exchange gap 114 and are not in contact with each other).

The fin receiving grooves 32 extend in the axial direction C of the cryocooler. The fin receiving grooves 32 are provided outside the cold fins 30 in the direction perpendicular to the axial direction C of the cryocooler, and pass through the heat conductive sleeve 110 of the member 104 to be cooled in the axial direction C of the cryocooler. The thickness (axial dimension) of the heat conductive sleeve 110 may be slightly larger than the thickness of the first-stage cooling stage 16a. Accordingly, the axial length of the fin receiving groove 32 may be larger than the height of the cold fin 30.

As shown in FIG. 2, the heat exchange gap 114 extends between the first-stage cooling stage 16a and the heat conductive sleeve 110 to be bent in a meandering shape in a plane perpendicular to the axial direction C of the cryocooler. On the other hand, since the cold fins 30 extend in the axial direction C of the cryocooler on the outer periphery of the first-stage cooling stage 16a and the fin receiving grooves 32 passes through the heat conductive sleeve 110 in the axial direction C of the cryocooler as described above, the heat exchange gap 114 provides a linear gas passage in the axial direction C of the cryocooler. The heat exchange gap 114 is not bent in a meandering shape in the axial direction C of the cryocooler.

For example, the heat exchange gap 114 has a constant width between the first-stage cooling stage 16a and the heat conductive sleeve 110. The width of the heat exchange gap 114 is in the range of, for example, 1 to 10 mm or 2 to 5 mm. A distance (radial dimension) between the tip end surface of the cold fin 30 and the surface of the fin receiving groove 32 facing this tip end surface is equal to a distance (circumferential dimension) between the side surface of the cold fin 30 and the side surface of the fin receiving groove 32 facing this side surface. Further, the distance between the tip end surface of the cold fin 30 and the surface of the fin receiving groove 32 facing this tip end surface is also equal to a distance between the first-stage cooling stage 16a and the heat conductive sleeve 110 at a portion between two cold fins 30 adjacent to each other in the circumferential direction.

The size and shape of the cold fin 30 and the size and shape of the corresponding fin receiving groove 32 are not particularly limited, and may be appropriately set according to, for example, heat exchange performance that is desired between the first-stage cooling stage 16a and the heat conductive sleeve 110, the flow channel resistance of the heat exchange gap 114, the amplitude of the vibration of the first-stage cooling stage 16a during the operation of the cryocooler 10, the size of particles that are expected to enter the heat exchange gap 114 together with gas, or other conditions. Further, it is not essential that two different cold fins 30 (and two corresponding fin receiving grooves 32) have the same sizes and shapes as each other, and the two different cold fins 30 (and two corresponding fin receiving grooves 32) may have sizes and shapes different from each other.

It is not essential that the fin receiving grooves 32 correspond to the cold fins 30 one to one. For example, in a case where the width of the fin receiving groove 32 is relatively large or in a case where the width of the cold fin 30 is relatively small and the cold fins 30 are arranged to be relatively close to each other, one fin receiving groove 32 may receive a plurality of cold fins 30.

The operation of the cryogenic device 100 according to the embodiment will be described with reference to FIG. 1 again. As described above, in this embodiment, the cryogenic device 100 is formed as a cryostat that has a function to recondense helium. In a case where the cryocooler 10 is operated, the first-stage cooling stage 16a and the second-stage cooling stage 16b are cooled to desired cooling temperatures. Since the first-stage cooling stage 16a is thermally coupled to the heat conductive sleeve 110 through the heat exchange gap 114 without being in contact with the heat conductive sleeve 110, the heat conductive sleeve 110 is cooled by the first-stage cooling stage 16a.

Helium gas is introduced into the member 104 to be cooled from the refrigerant introduction port 103 as shown by an arrow B1, and flows to the vicinity of the first-stage cooling stage 16a and the heat conductive sleeve 110. The helium gas is cooled while passing through the heat exchange gap 114 in the axial direction C of the cryocooler as shown by an arrow B2, and enters the liquefied refrigerant tank 108. The helium gas is cooled by the second-stage cooling stage 16b and is liquefied at the second-stage cooling stage 16b. The liquefied helium drops from the second-stage cooling stage 16b and is stored in the bottom of the liquefied refrigerant tank 108.

Liquid helium is used to cool objects. An object to be cooled may be disposed in the same cryostat. Alternatively, an object to be cooled may be disposed at another place, and liquid helium may be supplied to the object to be cooled through a liquid helium conduit extending from the cryostat. As a result, evaporated helium is collected and is introduced into the member 104 to be cooled from the refrigerant introduction port 103 again. In this way, the cryogenic device 100 can construct a cryogenic circulation cooling system that uses a cryogenic refrigerant.

As described above, in the cryogenic device 100 according to the embodiment, the first-stage cooling stage 16a includes the cold fins 30 that extends toward the heat conductive sleeve 110 of the member 104 to be cooled in the direction perpendicular to the axial direction C of the cryocooler, and the fin receiving grooves 32, which are recessed in the direction perpendicular to the axial direction C of the cryocooler, are formed in the heat conductive sleeve 110 of the member 104 to be cooled. The fin receiving grooves 32 extend in the axial direction C of the cryocooler. The heat conductive sleeve 110 of the member 104 to be cooled receives the cold fins 30 in the fin receiving grooves 32 with the heat exchange gap 114.

Accordingly, all or most of the heat exchange gap 114, which is also a gas passage, can be a linear path extending in the axial direction C of the cryocooler. As compared to a meandering path, the flow of gas passing through the heat exchange gap 114 is facilitated and the clogging of the heat exchange gap 114 caused by particles, which may be contained in the flow of gas, is also less likely to occur.

Further, since the first-stage cooling stage 16a is provided with the cold fins 30 and the heat conductive sleeve 110 is provided with the fin receiving grooves 32, a heat exchange area is increased. As a result, the efficiency of heat exchange between the first-stage cooling stage 16a and the heat conductive sleeve 110 is improved.

Since high-pressure refrigerant gas periodically enters and exits from the cryocooler 10 as described above, pressure fluctuations are caused. Since such pressure fluctuations causes cryogenic connecting parts, which are connected to the cooling stage 16 including the pulse tube 12 and the regenerator tube 14, to periodically expand and contract in the axial direction C of the cryocooler, the periodic position fluctuations of the cooling stage 16 in the axial direction C of the cryocooler are caused. In this way, during the operation of the cryocooler 10, the cooling stage 16 may oscillate with a larger amplitude in the axial direction C of the cryocooler than in other directions.

According to the cryogenic device 100 of the embodiment, the fin receiving grooves 32 extend in the axial direction C of the cryocooler and the cold fins 30 are inserted into the fin receiving grooves 32 with the heat exchange gap 114, so that the heat exchange gap 114 is formed in the direction perpendicular to the axial direction C of the cryocooler. For this reason, even though the first-stage cooling stage 16a, that is, the cold fins 30 oscillate in the axial direction C of the cryocooler, the first-stage cooling stage 16a is less likely to be in contact with the heat conductive sleeve 110. Accordingly, the size of the heat exchange gap 114 can be set to be relatively small, which also contributes to the improvement of the efficiency of heat exchange.

Further, the fin receiving grooves 32 are provided outside the cold fins 30 in the direction perpendicular to the axial direction C of the cryocooler, and pass through the heat conductive sleeve 110 of the member 104 to be cooled in the axial direction C of the cryocooler. Accordingly, the heat exchange gap 114 is a linear gas passage that extends from the upper surface of the heat conductive sleeve 110 to the lower surface thereof. The flow of gas passing through the heat exchange gap 114 is facilitated, and the clogging of the heat exchange gap 114 caused by particles, which may be contained in the flow of gas, is also less likely to occur. Furthermore, since the axial direction C of the cryocooler coincides with the vertical direction (direction of gravity) in this embodiment, an effect that particles fall due to own weight without stopping in the heat exchange gap 114 is also expected, which may also help to avoid the clogging of the heat exchange gap 114.

Figure 3:
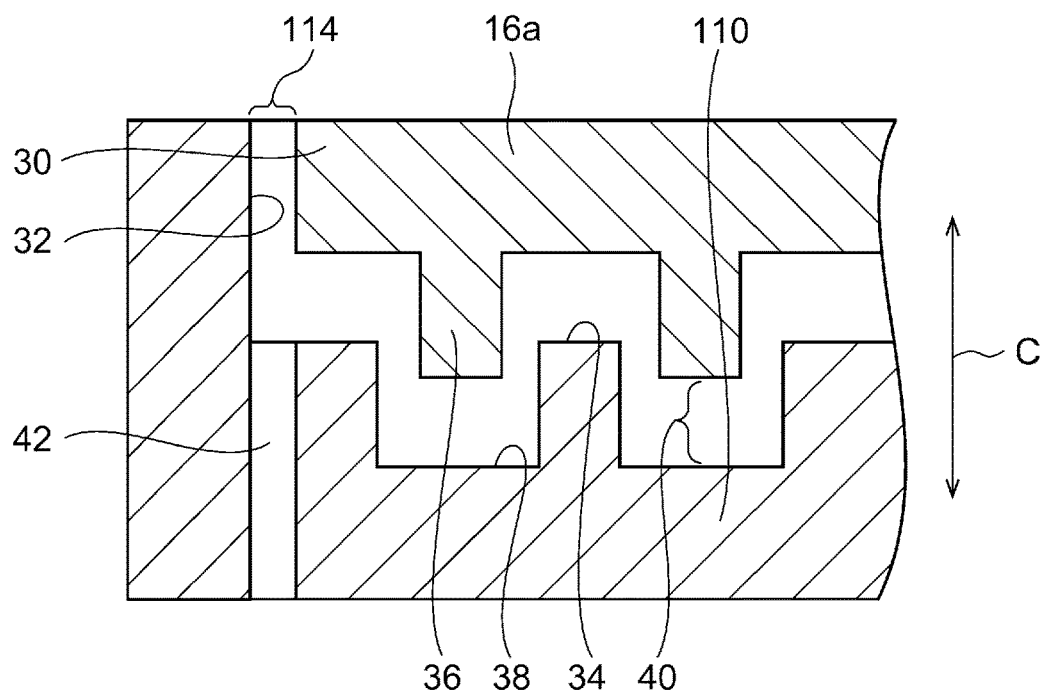
FIG. 3 is a schematic cross-sectional view showing another embodiment.

FIG. 3 is a schematic cross-sectional view showing another embodiment. As in the above-mentioned embodiment, a first-stage cooling stage 16a includes cold fins 30 that extend toward a heat conductive sleeve 110 in a direction perpendicular to an axial direction C of a cryocooler. Fin receiving grooves 32, which are recessed in the direction perpendicular to the axial direction C of the cryocooler, are formed in the heat conductive sleeve 110. The fin receiving grooves 32 extend in the axial direction C of the cryocooler. The heat conductive sleeve 110 of a member 104 to be cooled receives the cold fins 30 in the fin receiving grooves 32 with a heat exchange gap 114.

The heat conductive sleeve 110 includes a surface (hereinafter, referred to as a facing surface 34) facing the bottom surface of the first-stage cooling stage 16a. The heat conductive sleeve 110 includes an inner peripheral rim extending inward in a radial direction, and the upper surface of the inner peripheral rim faces the bottom surface of the first-stage cooling stage 16a as the facing surface 34. An interval 40 between the bottom surface of the first-stage cooling stage 16a and the facing surface 34 in the axial direction C of the cryocooler is larger than the heat exchange gap 114 in the direction perpendicular to the axial direction C of the cryocooler.

One or a plurality of stage bottom fins 36, which extend downward (for example, toward the second-stage cooling stage 16b) in the axial direction C of the cryocooler, are provided on the bottom surface of the first-stage cooling stage 16a. Bottom fin-receiving recessed portions 38, which receive the stage bottom fins 36, are formed on the upper surface of the heat conductive sleeve 110. The bottom fin-receiving recessed portions 38 are recessed in the axial direction C of the cryocooler to correspond to the stage bottom fins 36 that extend in the axial direction C of the cryocooler. Since the interval 40 is formed, the stage bottom fins 36 are not in contact with the inner peripheral rim of the heat conductive sleeve 110 and the first-stage cooling stage 16a and the heat conductive sleeve 110 are thermally coupled to each other without being in contact with each other as in the above-mentioned embodiment.

The fin receiving grooves 32 are provided outside the cold fins 30 in the direction perpendicular to the axial direction C of the cryocooler, and pass through the heat conductive sleeve 110 of the member 104 to be cooled in the axial direction C of the cryocooler. The heat exchange gap 114 is formed between the cold fins 30 and the fin receiving grooves 32. A through-slit 42, which passes through the first-stage cooling stage 16a in the axial direction C of the cryocooler, is formed in the inner peripheral rim of the first-stage cooling stage 16a. The heat exchange gap 114 and the through-slit 42 are arranged in line in the axial direction, so that a linear path along which gas can pass is formed by the heat exchange gap 114 and the through-slit 42. According to even this configuration, the flow of gas passing through the heat exchange gap 114 and the through-slit 42 is facilitated and the clogging of the heat exchange gap 114 caused by particles, which may be contained in the flow of gas, is also less likely to occur.

Since the first-stage cooling stage 16a is provided with the cold fins 30 and the stage bottom fins 36 and the heat conductive sleeve 110 is provided with the fin receiving grooves 32 and the bottom fin-receiving recessed portions 38, a heat exchange area is increased. As a result, the efficiency of heat exchange between the first-stage cooling stage 16a and the heat conductive sleeve 110 is improved.

Further, as described above, vibration, which may be generated by the cryocooler 10, has a relatively larger amplitude in the axial direction C of the cryocooler than in other directions. Since the interval 40 between the bottom surface of the first-stage cooling stage 16a and the facing surface 34 in the axial direction C of the cryocooler is larger than the heat exchange gap 114 in the direction perpendicular to the axial direction C of the cryocooler, the first-stage cooling stage 16a is less likely to be in contact with the heat conductive sleeve 110 even though the first-stage cooling stage 16a, that is, the cold fins 30 oscillate in the axial direction C of the cryocooler. Accordingly, the size of the heat exchange gap 114 can be set to be relatively small, which also contributes to the improvement of the efficiency of heat exchange.

The first-stage cooling stage 16a may not include the stage bottom fins 36. The bottom surface of the first-stage cooling stage 16a may be flat and the facing surface 34 of the heat conductive sleeve 110 may also be flat to correspond to the flat bottom surface.

The heat conductive sleeve 110 may not include the through-slit 42. In this case, a gas passage is formed of the interval 40, which is formed between the bottom surface of the first-stage cooling stage 16a and the facing surface 34 of the heat conductive sleeve 110, and the heat exchange gap 114. The interval 40 may be regarded as a part of the heat exchange gap 114.

The invention has been described above on the basis of the embodiments. It is understood by those skilled in the art that the invention may have various design changes and various modification examples without being limited to the above-mentioned embodiments and the modification examples are also included in the scope of the invention. Various features described in relation to a certain embodiment can also be applied to other embodiments. A new embodiment formed from combination has the effects of the respective combined embodiments.

The first-stage cooling stage 16a has a discoid shape and the heat conductive sleeve 110 has an annular shape in the above-mentioned embodiments, but the shapes of these are not particularly limited. For example, the first-stage cooling stage 16a may have the shape of a rectangular plate, and the heat conductive sleeve 110 may have the shape of a rectangular frame that surrounds the rectangular plate-like first-stage cooling stage 16a.

The cold fins 30 are provided on the first-stage cooling stage 16a and the cold fins 30 are accommodated in the fin receiving grooves 32 in the above-mentioned embodiments, so that a non-contact heat transfer structure of the first-stage cooling stage 16a and the heat conductive sleeve 110 is formed. However, such a non-contact heat transfer structure may be applied to the second-stage cooling stage 16b instead of the first-stage cooling stage 16a or together with the first-stage cooling stage 16a.

The cryocooler 10 is not limited to a pulse tube cryocooler and may be a GM cryocooler or other cryocoolers. For example, in the case of a GM cryocooler, the "regenerator tube" of the above-mentioned embodiment may be a cylinder that accommodates a displacer in which a regenerator is built. The GM cryocooler does not include a pulse tube.

The cryogenic device 100 may use a refrigerant other than helium. In a case where the refrigerant is used, the cryocooler 10 has only to provide the liquefaction temperature of the refrigerant and may be a single-stage cryocooler.

Although the invention has been described using specific words and phrases on the basis of the embodiments, the embodiments merely illustrate one aspect of the principle and application of the invention. Many modification examples and changes in arrangement are allowed in the embodiments without departing from the scope of the invention defined in claims.

INDUSTRIAL APPLICABILITY

The invention can be used in the fields of a cryogenic device and a cryostat.

It should be understood that the invention is not limited to the above-described embodiment, but may be modified into various forms on the basis of the spirit of the invention. Additionally, the modifications are included in the scope of the invention.

What is claimed is:
1. A cryogenic device comprising:
a hermetic container;
a cryocooler that includes:
  a mounting portion mounted on the hermetic container,
  a connecting part extending from the mounting portion into the hermetic container in an axial direction of the cryocooler, and a cooling stage attached to the connecting part and disposed in the hermetic container;

a member to be cooled that is disposed in the hermetic container with a gap between the cooling stage and the member to be cooled, the member to be cooled configured to allow heat exchange with the cooling stage through the gap; and a refrigerant introduction port configured to introduce a refrigerant gas into the member to be cooled, wherein the cooling stage includes a cold fin that extends toward the member to be cooled in a direction perpendicular to the axial direction of the cryocooler, and a fin receiving groove recessed in the direction perpendicular to the axial direction of the cryocooler, the fin receiving groove formed in the member to be cooled, the fin receiving groove extending in the axial direction of the cryocooler, and wherein the member to be cooled is configured to receive the cold fin in the fin receiving groove with the gap, wherein the member to be cooled includes a liquefied refrigerant tank that stores the refrigerant gas in liquid phase, and wherein the refrigerant has introduced from the refrigerant introduction port flows through the gap into the liquefied refrigerant tank.

2. The cryogenic device according to claim 1, wherein the fin receiving groove is provided outside the cold fin in the direction perpendicular to the axial direction of the cryocooler, and wherein the fin receiving groove passes through the member to be cooled in the axial direction of the cryocooler.

3. The cryogenic device according to claim 1, wherein the member to be cooled includes a first surface facing a bottom surface of the cooling stage, and an interval between the bottom surface of the cooling stage and the first surface in the axial direction of the cryocooler is larger than the gap in the direction perpendicular to the axial direction of the cryocooler.

4. The cryogenic device according to claim 1, wherein the cryocooler is a pulse tube cryocooler, and the connecting part includes a pulse tube.

5. The cryogenic device according to claim 1, wherein the cooling stage is shaped like an external gear as seen in the axial direction of the cryocooler.

6. The cryogenic device according to claim 1, wherein the member to be cooled includes a heat conductive sleeve attached to the liquefied refrigerant tank, and the liquefied refrigerant tank is cooled by the cryocooler through the heat conductive sleeve.

7. The cryogenic device according to claim 6, wherein the heat conductive sleeve faces only an outer peripheral surface of the cooling stage provided with the cold fin.

8. The cryogenic device according to claim 7, wherein the heat conductive sleeve does not cover a bottom surface and an upper surface of the cooling stage.

9. The cryogenic device according to claim 1, wherein the gap provides a linear gas passage for the refrigerant gas in the axial direction of the cryocooler.

10. A cryostat comprising:
a hermetic container;
a cryocooler that includes:
a mounting portion mounted on the hermetic container,
a connecting part extending from the mounting portion into the hermetic container in an axial direction of the cryocooler, and
a cooling stage attached to the connecting part and disposed in the hermetic container;

a member to be cooled that is disposed in the hermetic container with a gap between the cooling stage and the member to be cooled, the member to be cooled configured to allow heat exchange with the cooling stage through the gap; and a refrigerant introduction port configured to introduce a refrigerant gas into the member to be cooled, wherein the cooling stage includes a cold fin that extends toward the member to be cooled in a direction perpendicular to the axial direction of the cryocooler, and a fin receiving groove recessed in the direction perpendicular to the axial direction of the cryocooler, the fine receiving groove formed in the member to be cooled, the fin receiving groove extending in the axial direction of the cryocooler, and wherein the member to be cooled is configured to receive the cold fin in the fin receiving groove with the gap, wherein the member to be cooled includes a liquefied refrigerant tank that stores the refrigerant gas in liquid phase, and wherein the refrigerant gas introduced from the refrigerant introduction port flows through the gap into the liquefied refrigerant tank.

\* \* \* \* \*